PROCESS FOR MAKING A COLOR SCREEN

Original Filed April 24, 1963

INVENTOR

Harvey L. Ratliff Jr.

Feb. 25, 1969 H. L. RATLIFF, JR 3,429,704

PROCESS FOR MAKING A COLOR SCREEN

Original Filed April 24, 1963 Sheet 2 of 3

(e) (f) (g)

INVENTOR

Harvey L. Ratliff Jr.

INVENTOR

Harvey L. Ratliff Jr.

United States Patent Office 3,429,704
Patented Feb. 25, 1969

3,429,704
PROCESS FOR MAKING A COLOR SCREEN

Harvey L. Ratliff, Jr., Oxon Hill, Md., assignor to Jetru Inc., Amarillo, Tex.

Original application Apr. 24, 1963, Ser. No. 275,411, now abandoned. Divided and this application Oct. 22, 1965, Ser. No. 500,725
U.S. Cl. 96—36.1 2 Claims
Int. Cl. G03 9/08

ABSTRACT OF THE DISCLOSURE

A quantity of radiant energy sensitive dichroic material with its axis of polarization in a first plane is extruded upon a work piece. This material is then exposed to three point sources of radiant energy through an affixed first mask and a removable second mask or equivalent with the first mask enabling the illumination by each said point source of narrow strips that will be struck by beams from the electron guns at the same location as the point sources later, said strips are each as high as the work piece but only half as wide as the lateral distance between each strip and enabling the illumination by all three point sources of the entire work piece, and with the second mask or an equivalent means enabling the illumination of strips which are each as wide and long as the area illuminated by all three point sources and blocking from illumination alternate adjacent strip areas of the same width. The material between the exposed strips is then removed and a quantity of radiant energy sensitive dichroic material with its axis of polarization substantially perpendicular to the first plane is extruded upon the work piece. This material is then exposed as before except means are used in conjunction with the second mask whereby the areas between the first exposed areas are alone exposed. The material in the first exposed areas is then removed leaving adjacent strips of oppositely polarized material upon the work piece. Then a red phosphor which is radiant energy sensitive is applied to the work piece and the areas thereof which will be struck by the red electron gun are exposed to the point source corresponding to the red electron gun through the affixed mask. The strips between these exposed strips are removed. Next a green phosphor which is radiant energy sensitized is applied to the work piece and areas thereof which will later be struck by the green electron gun are exposed to the point source corresponding to the green electron gun through the affixed mask. The strips of green phosphor between the exposed strips of green phosphor are then removed. Next a blue phosphor which is radiant energy sensitive is applied to the work piece and areas thereof which will later be struck by the blue electron gun are exposed to the point source corresponding to the blue electron gun through the affixed mask. And finally the strips of blue phosphor between the exposed strips of blue phosphor are removed leaving strips of red, green, and blue phosphor on top of the strips having said first axis of polarization adjacent strips of red, green, and blue phosphor on top of the strips having said second axis of polarization, to thus enable a new form of wide angle stereoscopic viewing.

The present invention relates generally to color screens used in cathode ray tubes. Its specific contemplated use is in color cathode ray tubes used in wide-angle stereoscopic viewers. This is a divisional application of my copending parent application 275,411, filed Apr. 24, 1963 now abandoned.

For extremely wide-angle stereoscopic viewing on a single screen, it is necessary for the left peripheral area of the right eye view to be re-produced on substantially the same area of the screen as the right peripheral area of the left eye view, if the oculars do not have short focal lengths.

It is the primary object of the present invention to teach a screen that may be used in single screen extremely wide-angle stereoscopic viewers which may also make possible recreations with high resolution.

Other objects and advantages of my invention will become more apparent from a study of the following description taken with the accompanying drawings wherein.

Figure 2:
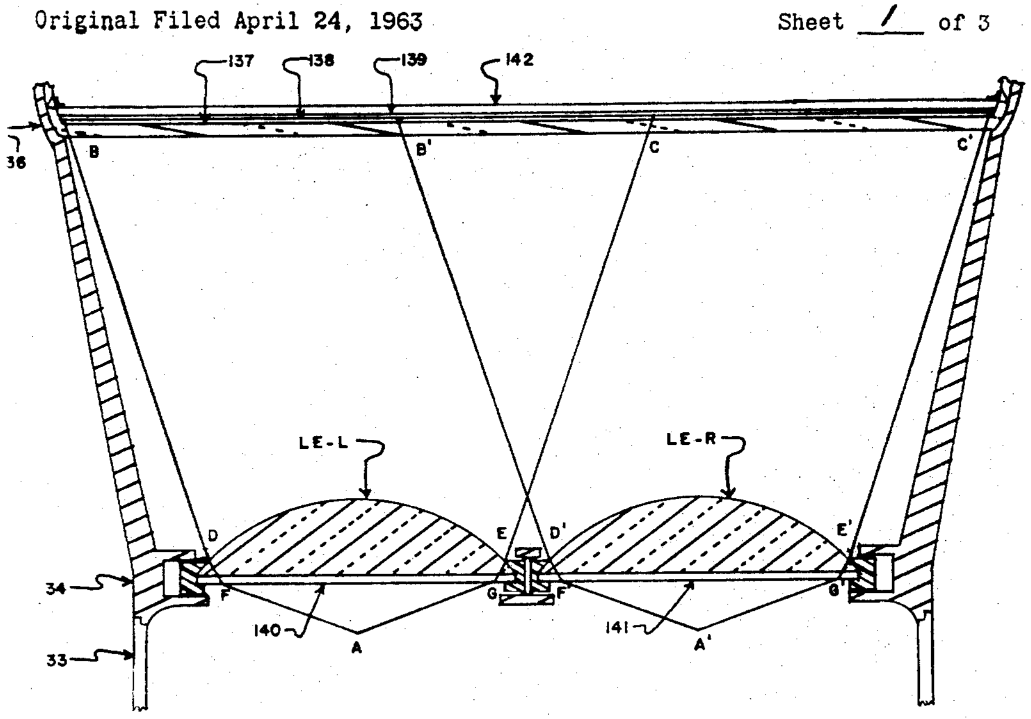
FIG. 2 is a sectional view of the optical portion of the kinescopic optical viewing device which illustrates a contemplated application of the present invention.
Figures 8, 9:
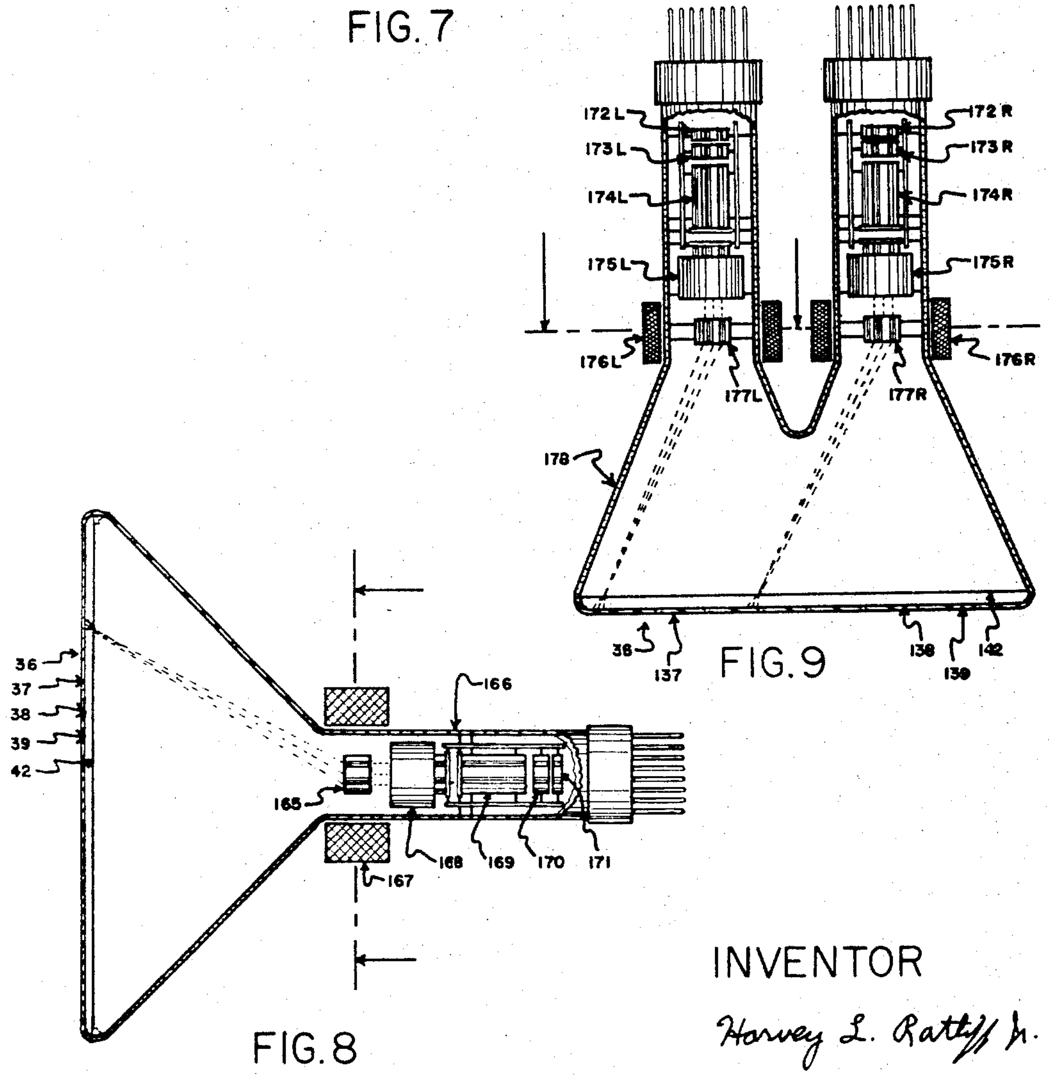
FIGS. 8 and 9 are sectional views of the cathode ray tube portion of the kinescopic optical viewing device also illustrating contemplated applications of the present invention.

The most contemplated application of the screen can be seen from first observing FIG. 2 in conjunction with FIGS. 8 and 9. The left and right eyes of the viewing observer are placed at positions A and A′ respectively. At position A said left eye has a wide angle of view GAF and at position A′ said right eye has a wide angle of view G′A′F′. A ray originating at C passes from fluorescent layer 139, through polarizing layer 138, through transparent supporting means 137, to point E on lens LE–L (where it is bent toward point G), through LE–L, through analyzer 140, to point G (where it is bent toward A), to point A. By similar ray tracing it is obvious that an image formed having a diameter BC (in the horizontal plane) would be seen as having the angle of view of GAF (in the horizontal plane). The same obviously applies to the right eye view image having a diameter B′C′. Polarizing layer 138 is made up of strip elements 138(*a*) and 138(*b*) which are oppositely polarized and described in more detail by the disclosed method hereinafter. Analyzer 140 is polarized to pass light from only 138(*a*) and analyzer 141 is polarized to pass light from only 138(*b*). Therefore, the window-free stereo re-creation (made clear in my previously filed U.S. Patent 3,293,358 resulting from S.N. 250,562, cited in the parent case S.N. 275,411 is possible with the screen of the present method.

There are two contemplated modes of forming the images upon screen 36 (produced by the present method) which are illustrated in FIGS. 8 and 9. Referring first to FIG. 9, tube 178 consists of an evacuated envelope containing two sets of three guns. Each gun, of course, consists of a heater, a cathode, a control grid (172L and 172R), an accelerating (or screen) grid (173L and 173R), a focusing electrode (174L and 174R), and a converging electrode (175L and 175R) as shown in FIG. 9. Placed just in front of said electrodes 175L and 175R toward screen 36 are two deflection yokes 176L and 176R. In the center of each deflection yoke is placed a chromatic aberration correcting element 177L and 177R respectively that need not be described in detail here but which is described in the parent case in detail. Referring now to FIG. 8 which is the mode most contemplated for the method specifically set forth herein (however an obviously equivalent method could, of course, be used in conjunction with the mode of FIG. 9). The signals from two stereo coupled pick up tubes (VL and VR as set forth in detail in the parent case) can be taken in the form necessary for the single tri-gun kinescopic optical viewing device (of FIG. 8 combined with FIG. 2) in overlapped relation by using a special electronic circuitry (specifically described in the parent case S.N. 275,411 with regard to FIG. 5 thereof). Said overlapped relation stems from the fact that the area of screen 36 between B′ and C is common to both the right eye view image (B′C′) and the left eye view image (BC) but is separately seen because of the separating system clearly described herein. Due to the special circuitry in the pick up apparatus of S.N. 275,411 (being described in detail in S.N. 275,411), a right eye view strip of the image is produced by a scan by all three guns behind the first polarized strip 138(*b*) between C′ and C for analyzer 141 (where 171, 170, 169, 168, and 165 correspond to each respective element 172L, 173L, 174L, 175L, 176L, and 177L respectively as described hereinabove with regard to FIG. 9 and in greater detail in S.N. 275,411), then a blank left eye view strip is produced behind the first adjacent strip 138(*a*) between C′ and C for analyzer 140, then a right eye view strip of the image is produced by a scan by all three guns behind the second adjacent polarized strip 138(*b*) between C′ and C for analyzer 141 etc. until the portion of the right eye view image between C′ and C is produced upon screen 36; next a right eye view strip of the image is produced by a scan by all three guns behind the first polarized strip 138(*b*) between C and B′ for analyzer 141, then the first left eye view strip between CB′ of the image is produced by a scan by all three guns behind the first adjacent strip 138(*a*) between C and B′ for analyzer 140, etc. until the portion of the right and left eye view image between C and B′ is produced upon screen 36; likewise the portion of the left eye view image between B′ and B is produced upon screen 36 and this scanning process is repeated fast enough so as to eliminate the well known "flicker." A following method is specifically set forth with reference to placing three point sources of radiant energy at points corresponding to the three electron guns of FIG. 8, but an equivalent method is readily made obvious thereby which would use two sets of three point sources in correspondence to FIG. 9.

Only as by way of example, if screen 36 is to be consistent with the example given in the parent case S.N. 275,411 of targets 7L and 7R the following must be true: If the scan lines are horizontal, there must be a total of 16,000 scan lines (8,000 for each eye). It is understood of course, that under some of the parameters of this invention the scanning must be vertical for the invention to work. If the scan lines are vertical, there must be 8,000 scan lines for each eye, but the center of each of these 8,000 scan lines for each eye is displaced the interpupillary distance of $2\frac{9}{16}''$; so if KD is designed such that screen 36 will be 7 inches wide, each of the 8,000 scan lines must have a combined width of $$(7-2\tfrac{9}{16})(2)/2=4\tfrac{7}{16}''$$

Therefore there would be: $8{,}000/4\frac{7}{16}=1805$ scan lines per inch for each eye and 3610 scan lines per inch. Therefore, for the above design there would be 25,270 total vertical scan lines on a 7″ screen, when the tube of FIG. 8 is used. Obviously, part of these 25,270 vertical scan lines would have no velocity modulation; thereby producing no image on screen 36. Only 16,000 of these scan lines are effective in producing an image.

Figure 1:
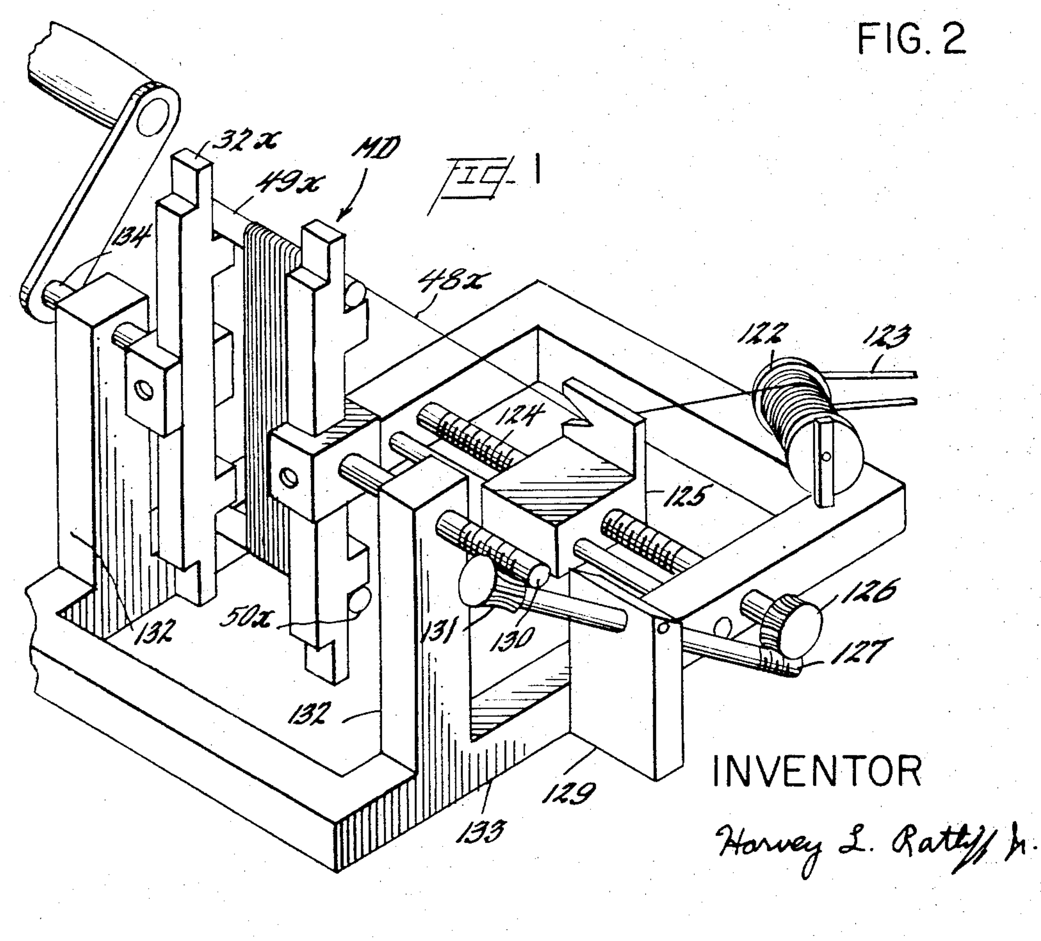
FIG. 1 is an elevational view designed to illustrate apparatus used in making the mask needed to make the screen of the present invention.
Figure 3:
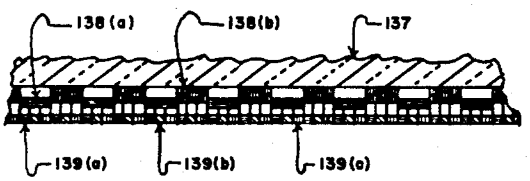
FIG. 3 is a partial sectional enlarged view of a contemplated screen of the present invention.
Figures 4, 5:
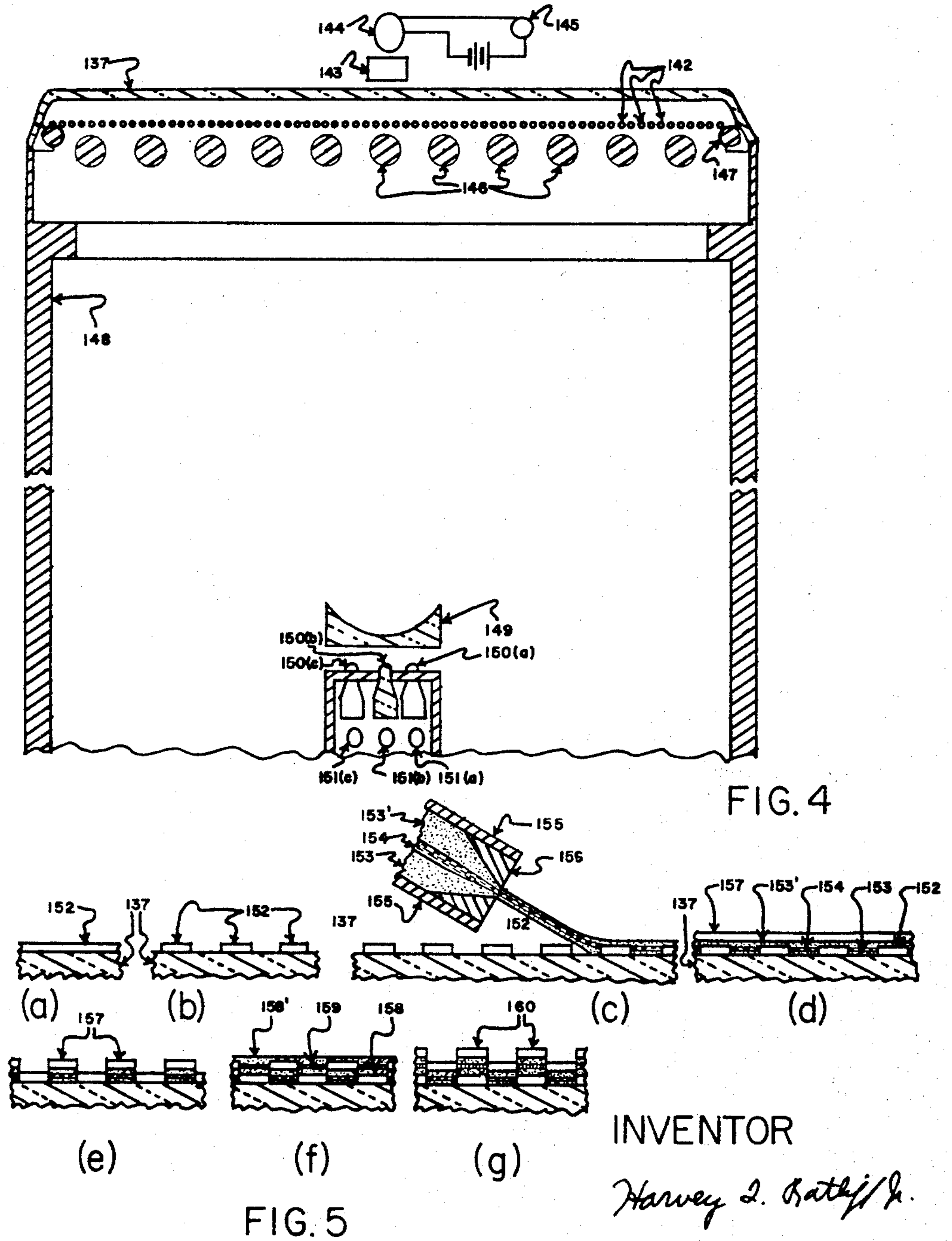
FIG. 4 is a partial sectional view of the apparatus used to make the screen of FIG. 3 and FIG. 7(*e*).
FIGS. 5 and 6 are partial sectional enlarged views designed to illustrate the steps taken in making the screen of FIG. 3.

At this point a contemplated method of making both basic forms of screen 36 will be set forth in detail. First the form of FIGS. 5 and 6 will be described. By way of example it will be assumed that a $7'' \times 4\frac{7}{16}''$ screen designed for horizontal scanning is desired. Since consistency with previous examples requires screen 36 to have 3,610 scan lines per inch, there must be 10,830 fluorescent elements 139 (3,610 of 139(*a*), 3,610 of 139(*b*), and 3,610 of 139(*c*)) per inch. Wires 142 (see FIG. 4 and FIGS. 8 and 9) having a diameter of about 0.0001844 inch are wound around masking frame 147 as shown in FIG. 4 by use of the device of FIG. 1 or any well known method. Frame 147 having been grooved with 3,610 grooves per inch in the manner described in the parent case. Therefore wires 142 of FIGS. 4, 8, and 9 are spaced apart about 0.0000922 inch. Light rods or transmitters 150(*a*), 150(*b*), and 150(*c*) are placed in identically the same positions (with respect to 142 and 137 as shown in FIGS. 4, 8, and 9) which will be occupied by the blue gun, green gun, and red gun respectively at a later date. Refracting means 149, which may be three separate diverging lenses, is designed to provide a means of correcting for the position of the screen by having refracting characteristics substantially equivalent to the deflecion characteristic of the electron lens used later in the tube. However, it is not necessary to have refracting means 149, any well known method of obtaining exposures of high resolution may be used. Wires 146 are wound around a frame (which is not shown) by the device of FIG. 1 or the like. Said frame has been grooved with 1,805 grooves per inch in the manner described above. Wires 146 shown in FIG. 4 have a diameter of about 0.000276 inch and are therefore spaced apart about 0.000276 inch. Said frame for wires 146 of FIG. 4 is made precisely adjustable by a micrometer screw arrangement such as the one described in detail in the parent case S.N. 275,411 as having the precision of the well known Rowland screw. At this point work piece 137 is rigidly held by frame 148 in any well known manner. Light rod 150(*a*) is illuminated by cylindrical lamp 151(*a*). Mask 146 is moved to the left until full illumination as measured by microammeter 145 reading current from phototube 144 (which works in conjunction with collimator 143). At this point mask 146 is moved back to the left, which causes an immediate drop in the reading of 145. Now mask 146 is cautiously moved back to the left by the worm gear arrangement described above and stopped at the instant full illumination is indicated by microammeter 145. Masking support 147 (which supports wires 142 as set forth hereinabove) is rigidly attached to work piece 137 in any well known manner. The internal surface of work piece 137 is coated with a substantially transparent radiant energy sensitive substance 152 of FIG. 5(*a*) such as the light sensitive material polyvinyl alcohol sensitized with ammonium dichromate. This coating may be applied by flowing, spraying, or other similar fluid depositing methods. At this point work piece 137 is rigidly held by frame 148 in any well known manner within a tolerance much less than the distance between light rods 150(*a*), (*b*), and (*c*). Now coating 152 as shown in FIG. 5(*a*) is exposed, with 142 and 146 in front thereof as set forth supra, to the light from all three light rods 150(*a*), 150(*b*), and 150(*c*) illuminated by cylindrical lamps 151(*a*), 151(*b*), and 151(*c*) respectively. The exposed areas become hardened and adhere to work piece 137. Next a developing fluid such as deionized water is applied to the work piece to remove the unhardened areas and to produce a series of bars or strips approximately 0.0002766 inch wide as shown in FIG. 5(*b*). At this point a radiant energy sensitive layer 153 having no crystals and being substantially transparent such as polyvinyl alcohol sensitized with ammonium dichromate is placed in a chamber formed by walls 155 and wedging elements 156 in any suitable fashion. Next the layer 153 as shown in FIG. 5(*c*) is placed a layer 154, preferably relatively thin, of material containing ultramicroscopic polarizing crystals (such as herepathite). Next to this layer and above it is placed a third layer 153′ of the same substance as layer 153. An opening between wedging elements 156 has dimensions substantially similar to a cross-section of layer 154 (behind the wedging elements) and is located adjacent to that layer. Means are provided for extruding the material through said opening. In this manner layer 154 is subjected only to the forces of stretch and not to the forces of shear, so that the said ultramicroscopic polarizing crystals are aligned substantially parallel. Therefore, layer 154 becomes dichroic. It is understood of course that only "beta" type crystals are used or that only "alpha" type, but not both types for the well known reasons. By way of example layer 154 is extruded perpendicular to strips 152 as shown in FIG. 5(*c*). An extra layer of radiant energy sensitive material 157 may or may not be put on as is desired (see FIG. 5(*d*)). At this point work piece 137 is placed back on frame 148 within the above stated tolerance limits. Now wires 146 are moved either to the left or the right 0.0002766 inch by said micrometer screw. Now conjugately and alternately related strips approximately 0.0002766 inch wide are now exposed (by all three light rods) and developed as shown by FIG. 5(*e*).

At this point another polarizing layer 159 is extruded as described above, with the following exception: Layer 159 is extruded parallel to said strips 152, not perpendicular as shown in FIG. 5(*c*). Layer 158 and 158' would be the lower and upper light sensitive sandwiching layers. Therefore, obviously, the axis of polarization of strips 159 is rotated 90 degrees from the axis of polarization of strips 154. Also extra radiant energy sensitive layer 160 may or may not be placed upon layer 158'.

Now work piece 137 is placed rigidly upon frame 148 as above, and wires 146 are moved about 0.0002766 inch in either direction. The conjugately and alternately related polarizing strips 159 are exposed and developed as shown in FIG. 5(*g*). Now another coating of radiant energy sensitive material 161 is sprayed or placed upon the work piece and exposed and developed in the above described manner resulting in FIG. 6(*a*) if layers 157 and 160 are desired and in FIG. 6(*b*) if layers 157 and 160 are not desired. Obviously 138(*a*) consists of 158', 159, and 158; and 138(*b*) consists of 153', 154, and 153.

Figure 6:
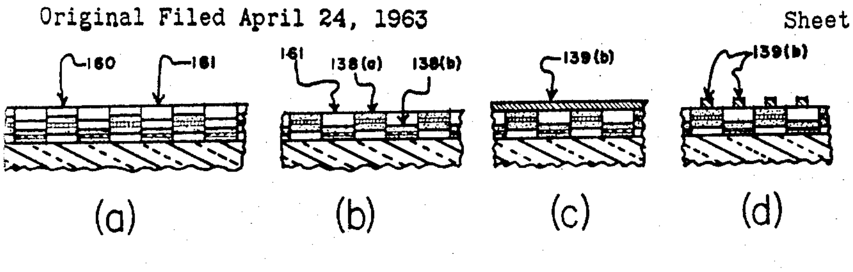

At this point mask 146 is removed. A slurry 139(*b*) of green phosphor material such as zinc orthosilicate and a suitable radiant energy sensitive material is sprayed or otherwise placed upon work piece 137 as shown in FIG. 6(*c*). Now work piece 137 is rigidly placed upon frame 148 as above and green light rod radiating white light 150(*b*) illuminated by 151(*b*) exposes only the areas the green gun of FIG. 8 is to make fluoresce later. Now these areas are developed by the application of any desirable developing fluid such as deionized water to remove the unhardened areas, as above, resulting in the configuration shown in FIG. 6(*d*). In similar manner red phosphor 139(*c*) and blue phosphor 139(*a*) being for example zinc phosphate and zinc sulfide respectively, each sensitized with a suitable radiant energy sensitive material, are exposed by light rods 150(*c*) and 150(*a*) respectively and developed as above.

Figure 7:
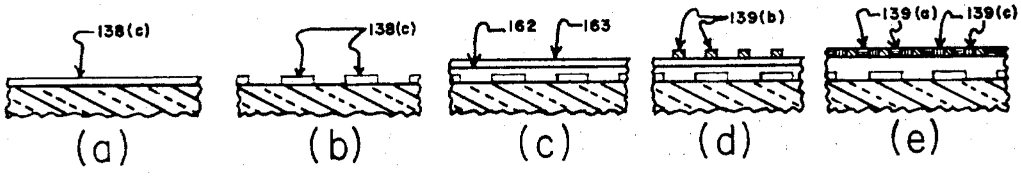
FIG. 7 shows partial sectional enlarged views designed to illustrate the steps taken in making the screen of FIG. 7(*e*).

Now the form of FIG. 7 will be described. In most situations this form requires that the scanning is vertical; therefore by way of example vertical scanning will be assumed and the same number of scan lines per inch will be assumed. Therefore the diameters of wires 142 and wires 146 are the same as before. However, there would obviously be more and each would be shorter. In other respects the apparatus of FIG. 4 is the same as before. Now some opaque radiant energy sensitive material 138(*c*) (such as polyvinyl alcohol having randomly dispersed herapathite crystals within it and being sensitized with ammonium dichromate) is flowed or otherwise placed upon work piece 137 as shown in FIG. 7(*a*). Now mask 146 is oriented as described above such that a viewing observer later can see only the right eye view blue, green and red phosphor elements (139(*a*), 139(*b*), and 139(*c*)) with his right eye and the left eye view blue, green and red phosphor elements with his left eye. At this point the proper areas are exposed by all three light rods and developed as above to result in FIG. 7(*b*). Now as many layers 162 and 163 of transparent radiant energy sensitive material may be applied and developed as required for proper function shown in FIG. 14 of my copending application S.N. 250,562, filed Jan. 10, 1963 now Patent No. 3,293,358 and shown in FIG. 7(*c*) for example. Green, red, and blue phosphors are placed upon layer 163 in the manner described above resulting in FIGS. 7(*d*) and 7(*e*).

I claim:

1. A process for making a color screen for a wide-angle stereoscopic optical viewing device which includes the steps of: first coating a work piece with substantially transparent radiant energy sensitive substance, second the exposing to a set of three point sources of radiant energy through a mask to define according to a difference in solubility a first set of alternately related discrete strip areas which are substantially the same distance apart, said strip areas are substantially three times as wide as an area illuminated by one of said point sources, and substantially the same width as a second set of discrete strip areas adjacent to and between said first set, third removing the strips from the unexposed strip areas by use of a suitable developing fluid, fourth extruding upon the surface formed from steps 1–3 a quantity of dichroic material sandwiched between two layers of radiant energy sensitive substance with the direction of flow substantially parallel to said unexposed strip areas to fill the same while subjecting the dichroic material as it flows to a stretching force causing orientation of the constituent particles of the material in a direction parallel to said unexposed strip areas, fifth the exposing to said point sources of radiant energy through a mask of the second set to define according to a difference in solubility strip areas which are located in areas which are unexposed in step two, sixth removing the strips of material applied in step four from the areas unexposed in step five, seventh coating this newly formed surface with a substantially transparent radiant energy sensitive substance, eighth the exposing to said point sources of radiant energy through a mask to define according to a difference in solubility the strip areas which are located in areas which are unexposed in step two, ninth removing the strips of material applied in step seven from the areas unexposed in step eight, tenth extruding upon the surface formed from steps 1–9 a quantity of dichroic material sandwiched between two layers of radiant energy sensitive substance with the direction of flow substantially perpendicular to said unexposed strips of material removed by step nine to fill the strip areas thereof while subjecting the dichroic material as it flows to a stretching force causing orientation of the constituent particles of the material in a direction perpendicular to said strips, eleventh exposing to said point sources of radiant energy through a mask to define according to a difference in solubility the strip areas which substantially overlie the strip areas laid down in steps 1 to 3, twelfth removing the strips of the material applied in step ten from the areas unexposed by step eleven, thirteenth coating the surface formed by steps 1–12 with a green phosphor material sensitized with a radiant energy sensitive material, fourteenth exposing the strip areas of the material of step thirteen to a first point source of said point sources through said mask, fifteenth removing the strips of material applied in step thirteen from the areas unexposed by step fourteen, sixteenth coating the surface formed by steps one to fifteen with a blue phosphor material sensitized with a radiant energy sensitive material, seventeenth exposing the strip areas of the material of step sixteen to a second point source of said point sources through said mask, eighteenth removing the strips of material applied in step sixteen from the areas unexposed by step seventeen, nineteenth coating the surface formed by steps 1–18 with a red phosphor material sensitized with a radiant energy sensitive material, twentieth exposing the strip areas of the material of step nineteen to a third point source of said point sources through said mask, and twenty-first removing the strips of material applied in step nineteen from the areas unexposed by step twenty, the green, blue and red phosphor strips together substantially completely cover each of the dichroic strips laid down in steps 4–6 and 10–12 respectively.

2. A process for making a color screen for wide-angle stereoscopic optical viewing devices which includes the steps of: first extruding upon a work piece a quantity of dichroic material sandwiched between two layers of radiant energy sensitive substance with the direction of flow in a first direction while subjecting the dichroic material as it flows to a stretching force causing orientation of the constituent particles of the material in a direction parallel to said first direction, second the exposing to a set of three point sources of radiant energy through a mask to define according to a difference in solubility a first set of alternately related discrete strip areas which are substantially the same distance apart, substantially three times as wide as an area illuminated by one of said point sources, and substantially the same width as a second set of discrete strip areas adjacent to and between said first set, third removing the strips of material from the areas unexposed by use of a suitable developing fluid, fourth extruding upon the surface formed by steps one to three a quantity of dichroic material sandwiched between two layers of radiant energy sensitive substance with the direction of flow substantially perpendicular to said first direction while subjecting the dichroic material as it flows to a stretching force causing orientation of the constituent particles of the material in a direction substantial-perpendicular to said first direction, fifth the exposing to said point sources of radiant energy through a mask of the strip areas which are located in areas which are unexposed in step two, sixth removing the strips of material applied in step four from the areas unexposed in step five, seventh coating the surface formed by steps one to six with a green phosphor material sensitized with a radiant energy sensitive material, eighth exposing the strip areas of the material to define according to a difference in solubility step seven to a first point source of said three point sources through said mask, ninth removing the strips of material applied in step seven from the areas unexposed by step eight, tenth coating the surface formed by steps one to nine with a blue phosphor material sensitized with a radiant energy sensitive material, eleventh exposing the strip areas of the material of step ten to a second point source of said three point sources through said mask, twelfth removing the strips of material applied in step ten from the areas unexposed by step eleven, thirteenth coating the surface formed by steps one to twelve with a red phosphor material sensitized with a radiant energy sensitive material, fourteenth exposing the strip areas of the material of step thirteen to a third point source of said three point sources through said mask, and fifteenth removing the strips of material applied in step thirteen from the areas unexposed by step fourteen, the green, blue and red phosphor strips together substantially completely cover each of the dichroic strips laid down in steps 1 to 3 and 4–6 respectively.

References Cited

UNITED STATES PATENTS

| | | | |
|---|---|---|---|
| 2,440,106 | 4/1948 | Land et al. | 96—49 |
| 2,464,586 | 3/1949 | Klein et al. | 96—40 XR |
| 2,870,010 | 1/1959 | Sadowsky et al. | 96—36.1 |
| 2,883,906 | 4/1959 | Rehorn | 178—6.5 XR |
| 3,165,578 | 1/1965 | Lauricella | 178—6.5 XR |
| 3,241,960 | 3/1966 | Mahler | 96—49 |
| 3,251,933 | 5/1966 | Beste | 178—6.5 |

NORMAN G. TORCHIN, *Primary Examiner.*

C. BOWERS, *Assistant Examiner.*

U.S. Cl. X.R.

96—40, 36; 350—132; 178—6.5

UNITED STATES PATENT OFFICE

CERTIFICATE OF CORRECTION

Patent No. 3,429,704 February 25, 1969

Harvey L. Ratliff, Jr.

It is certified that error appears in the above identified patent and that said Letters Patent are hereby corrected as shown below:

Column 7, line 36, "of" should read -- to define according to a difference in solubility --. Column 8, lines 2 and 3, "to define according to a difference in solubility" should read -- of --.

Signed and sealed this 24th day of March 1970.

(SEAL)
Attest:

Edward M. Fletcher, Jr.
Attesting Officer

WILLIAM E. SCHUYLER, JR.
Commissioner of Patents